(12) United States Patent
Weng

(10) Patent No.: US 8,001,849 B2
(45) Date of Patent: Aug. 23, 2011

(54) SELF-COMPENSATING MAGNETOELASTIC TORQUE SENSOR SYSTEM

(76) Inventor: Wensheng Weng, Canton, MI (US)

( * ) Notice: Subject to any disclaimer, the term of this patent is extended or adjusted under 35 U.S.C. 154(b) by 186 days.

(21) Appl. No.: 12/383,748

(22) Filed: Mar. 28, 2009

(65) Prior Publication Data

US 2010/0242626 A1    Sep. 30, 2010

(51) Int. Cl.
*G01L 3/02* (2006.01)
(52) U.S. Cl. .................................. 73/862.333
(58) Field of Classification Search ......... 73/862.331–862.335
See application file for complete search history.

(56) References Cited

U.S. PATENT DOCUMENTS

| | | | |
|---|---|---|---|
| 4,196,875 A * | 4/1980 | Tatekawa et al. | 242/334.1 |
| 4,506,554 A | 3/1985 | Blomkvist et al. | |
| 4,627,298 A | 12/1986 | Sahashi et al. | |
| 4,760,745 A * | 8/1988 | Garshelis | 73/862.333 |
| 4,873,874 A | 10/1989 | Sobel | |
| 4,976,160 A * | 12/1990 | Dobler et al. | 73/862.336 |
| 4,989,460 A | 2/1991 | Mizuno et al. | |
| 5,083,359 A | 1/1992 | Aminder et al. | |
| 5,351,555 A | 10/1994 | Garshelis | |
| 5,646,356 A | 7/1997 | Ling et al. | |
| 5,889,215 A | 3/1999 | Kilmartin et al. | |
| 6,047,605 A | 4/2000 | Garshelis | |
| 6,222,363 B1 * | 4/2001 | Cripe | 324/253 |
| 6,341,534 B1 * | 1/2002 | Dombrowski | 73/862.333 |
| 6,532,832 B2 * | 3/2003 | Shahcheraghi et al. | 73/862.333 |
| 6,553,847 B2 * | 4/2003 | Garshelis | 73/862.336 |
| 6,581,480 B1 | 6/2003 | May et al. | |
| 6,826,969 B1 | 12/2004 | May | |
| 6,904,814 B2 | 6/2005 | May | |
| 6,910,391 B1 | 6/2005 | May | |
| 7,095,198 B1 * | 8/2006 | O'Brien | 318/432 |
| 7,143,656 B2 * | 12/2006 | Wan et al. | 73/862.331 |
| 7,302,867 B2 | 12/2007 | May | |
| 7,493,831 B2 * | 2/2009 | Varonis | 73/862.333 |
| 2009/0230953 A1 | 9/2009 | Lee | |
| 2009/0276145 A1 * | 11/2009 | Schafer et al. | 701/105 |

OTHER PUBLICATIONS

Author unknown, Brief Introduction to Magnetoelastic Torque Sensors, http://www.magcanica.com/torque.html, (2008).

* cited by examiner

*Primary Examiner* — Max Noori
(74) *Attorney, Agent, or Firm* — Preston Smirman; Smirman IP Law, PLLC

(57) ABSTRACT

A magnetic torque transducer arrangement for self-compensating effects of external magnetic sources and temperature offset includes a shaft with at least one magnetized zone, at least one active magnetic field sensor and at least one passive magnetic field sensor disposed in such a way that the active field sensor is always in a position with higher magnetic field strength arising from applied torque than that of the passive sensor. Passive field sensors may also be placed on both sides of the active field sensor, or on only one side of the active field sensor. The transducer output is obtained by subtracting the output of the passive field sensors from that of the active field sensor, thus canceling out the effect of the interfering magnetic field flux and temperature offset on the torque transducer, and partially filtering out the temperature sensitivity drift and rotational dependant signal.

17 Claims, 4 Drawing Sheets

ID USING MAGNETIC SENSORS

SELF-COMPENSATING MAGNETOELASTIC TORQUE SENSOR SYSTEM

CROSS-REFERENCE TO RELATED APPLICATIONS

Not Applicable

FEDERALLY SPONSORED RESEARCH

Not Applicable

SEQUENCE LISTING OR PROGRAM

Not Applicable

BACKGROUND OF THE INVENTION

1. Field of the Invention

This invention relates to the field of using magnetic sensors to measure torque applied to a rotatable shaft. More particularly, the invention relates to the particular placement of magnetic field sensors in relation to a magnetic transducer element to measure the torque applied to a shaft, and the sensor system is immune to external magnetic sources within a large temperature range.

2. Prior Art

Magnetic torque sensors are known in the art. Many versions of this type of magnetoelastic torque sensor have been proposed and described in a plurality of publications and patent specifications. There are two general ways of utilizing the magnetoelastic phenomenon as the sensing mechanism for a non-contacting torque sensor. One is permeability based, and the other is polarized band based.

In permeability based types of magnetoelastic torque sensors, the permeability changes in the shaft surface, caused by the stress-induced magnetic anisotropy, affect the permeance of a magnetic flux path which includes a magnetizing source and a sensing coil. In these type of devices, the magnetic property effectively sensed is a permeability $\mu$, of one form or another, the output signals are derived from a magnetic flux density B of a flux that arises in response to an excitation field H with $B=\mu H$, where $\mu$ is altered by the stress and hence by the transmitted torque. This results in different voltages being induced in the sense winding encircling the two regions and this difference provides the measure of the torque. This kind of transducer comprises a shaft with surrounding excitation windings and measuring windings. Concentrically with the windings, anisotropic measuring zones are created in the shaft by different methods, e.g., by attaching a sleeve of magnetic material, formed with two parallel, annular zones which are provided with slits having a substantially regular pitch and making an angle of ±45° with a generatrix of the envelope surface of the sleeve (U.S. Pat. No. 4,506,554 to Blomkvist et al.) or by applying layers, such as copper strips, on the surface of the shaft (U.S. Pat. No. 5,646,356 to Ling et al.). Another method is forming a series of parallel grooves and/or lands or protuberances inclined at a suitable angle with the longitudinal axis of the shaft (U.S. Pat. No. 4,823,620 to Edo et al.) or a shaft having a magnetostrictive film (Pub. No. U.S. 2007/0245833 A1 to Yoneda et al.), or a pair of amorphous magnetic ribbons bonded to a shaft (U.S. Pat. No. 4,907,462 to Obama et al.).

An example of a commercially offered permeability based magnetoelastic torque transducer is that offered under the Trade Mark Torductor by the Force Measurement division of ABB AB, S-721 59 Vasteras, Sweden.

In polarized band types of magnetoelastic torque sensors, sensor operation is based on the reorienting effects of torsional stress on the individual magnetic moments that have been remanently circularly magnetized. In response to the magnetoelastic energy associated with the biaxial principal stresses by which torque is transmitted along the shaft, each moment will rotate towards the nearest positive principal stress direction and away from the nearest negative principal direction. This reorientation of the originally circular magnetization results in a net axial magnetization component. The divergence of this component at the edges of the polarized bands is the source of a magnetic field in the space around the shaft that can be readily measured with one or more magnetic field sensors. This type of transducer can be constructed either with a thin ring of magnetoelastically active material rigidly attached to the shaft (U.S. Pat. No. 5,351,555 to Garshelis), or by using a portion of the solid or hollow shaft itself as the magnetoelastically active element (U.S. Pat. No. 6,047,605 to Garshelis, and U.S. Pat. No. 6,581,480 B1 to May et al.). The magnetoelastic zone may also be remanently longitudinally magnetized.

An example of a commercially offered polarized band based magnetoelastic torque transducer is that offered by the Magna-Lastic Devices, Inc, a division of Methode Electronics, Inc, 7401 West Wilson Avenue, Chicago, Ill.

The basic weakness in these prior art approaches to magnetoelastic torque transducers is that they can not distinguish whether the sensed quantity, i.e., magnetic flux B, is depended on torsional stress induced by applied torque or an external magnetic flux source, or a temperature dependent magnetic flux, thus with the undesirable result that the sensed variations in B do not unambiguously indicate a variation in torque.

Most prior art devices employ a construction of common mode rejection to filter out uniform external magnetic flux, known as far field, e.g. magnetic field, by providing two distinct B dependent signals, having equal quiescent values, but opposite responses to torque, with means for combining the two signals differentially. This demands great care in matching the sensitivity of the two magnetic flux B sensors. This configuration can not eliminate non-uniform external magnetic flux sources, known as near field, such as a nearby electric motor, or a nearby moving ferromagnetic object.

Another attempt to avoid external magnetic flux is to position a magnetic shield around the transducer to protect it from external magnetic sources, as detailed in U.S. Pat. No. 5,083,359 to Aminder et al. and U.S. Pat. No. 5,889,215 to Kilmartin et al.

Yet another attempt to compensate the interference field was by energizing coils to provide a counteracting magnetic field, as detailed in U.S. Pat. No. 6,826,969 B1 to May.

Unfortunately, providing sufficient space for the requisite shield and counteracting coils has created practical problems in applications where space is at a premium, also, such a shield appears to be impractically expensive for using on highly cost-competitive devices, such as in automotive applications, and these approaches increase the complexity and the cost of a complete sensor while also generally reducing its adaptability, maintainability and reliability. These approaches also do not compensate for the temperature offset effect and rotation-dependent output.

SUMMARY OF THE INVENTION

The present invention was devised to provide a magnetoelastic torque transducer that can overcome the aforementioned problems, and one object of the invention is providing a torque transducer having high reliability.

Another object of the present invention is to provide a magnetoelastic torque transducer that filters out the effects of external magnetic flux sources.

A further object of the present invention is to provide a magnetoelastic torque transducer that can compensate for temperature offset.

Another object of the present invention is to provide a magnetoelastic torque transducer that compensates for rotation dependent output.

A further object of the invention is to provide a magnetoelastic torque transducer that can compensate for temperature sensitivity drift.

Another object of the invention is to provide a magnetoelastic torque transducer that requires less axial space, and with greater tolerance on shaft axial movement.

An additional object of the present invention is to provide a magnetoelastic torque transducer which symmetry matches the sensitivity of paired magnetic flux B sensors electrically so that a complete common mode rejection can be accomplished.

These objects and others are achieved by providing a torque sensor comprising at least one magnetoelastically active element, at least one magnetic field sensor, responsive to the field of the magnetoelastically active portion arising from applied torque (active field sensor), and at least one magnetic field sensor that is not responsive to the field of the magnetoelastically active portion arising from applied torque, so that this sensor can not sense most of, or all, of the magnetic flux caused by applied torque (passive field sensor). The output signals of the active and passive field sensors are independently processed, so when there is magnetic flux variation detected by the active field sensor(s) proximate to the active transducer zone and little, or no, magnetic field variation is sensed by the passive field sensor(s), that means all the magnetic field variation sensed by the active field sensor(s) is cause by applied torque. When there are magnetic field flux variations detected by both the active and passive field sensors, it indicates that there is external magnetic flux, be it caused by temperature changes, rotating shaft, or an external magnetic source e.g., an electric motor.

Alternatively, a passive field sensor (or sensors) can be placed proximate to the active magnetoelastic zone with lower field strength than that of active field sensor to partially compensate the rotational dependent signal and temperature sensitivity drift.

To establish precise symmetry in the two magnetic flux B sensors demands great care, and in the real world it is very hard to achieve, thus common mode rejection is not completely effective without precise symmetry matched field sensors. When placing the torque transducer in a uniform magnetic field, because the output of active and passive field sensors is separated, their sensitivity can be electrically adjusted to achieve precise symmetry.

The invention permits lower manufacturing cost and ease of use as compared with the prior transducer technology, and the sensor system is robust enough for most harsh environments.

DRAWINGS—REFERENCE NUMERALS

| 10 | Axis | 12 | Shaft |
|---|---|---|---|
| 14 | Active Magnetoelastic zone | 16 | Magnetic Passive Area |
| 18 | Active Field Sensor | 19, 20 | Passive Field Sensor |
| 22 | Wire | 24 | Magnetic Flux Dependent On Torque |
| 26 | External Magnetic Flux | | |

DESCRIPTION OF THE PREFERRED EMBODIMENTS

Figure 1:
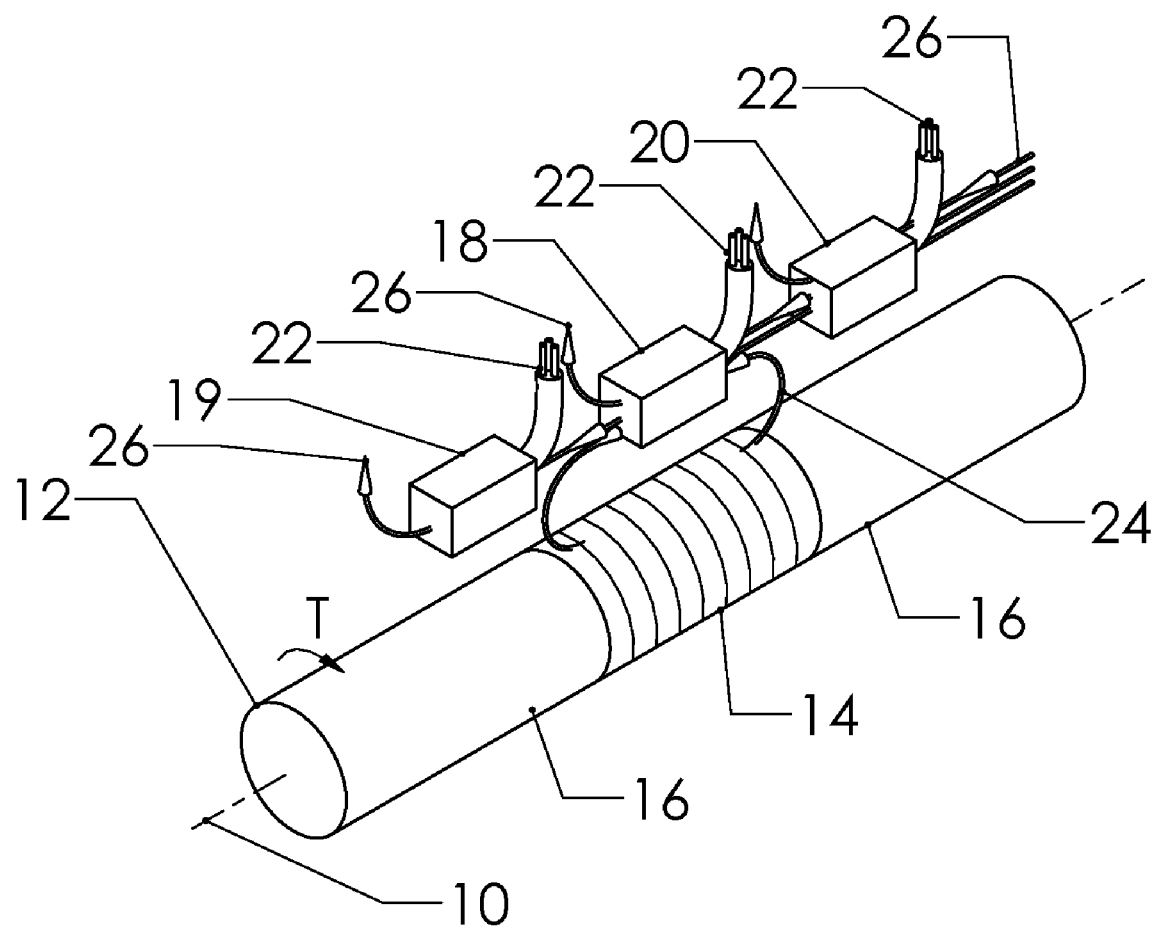
FIG. 1 shows a first schematic view of the present invention.
Figure 2:
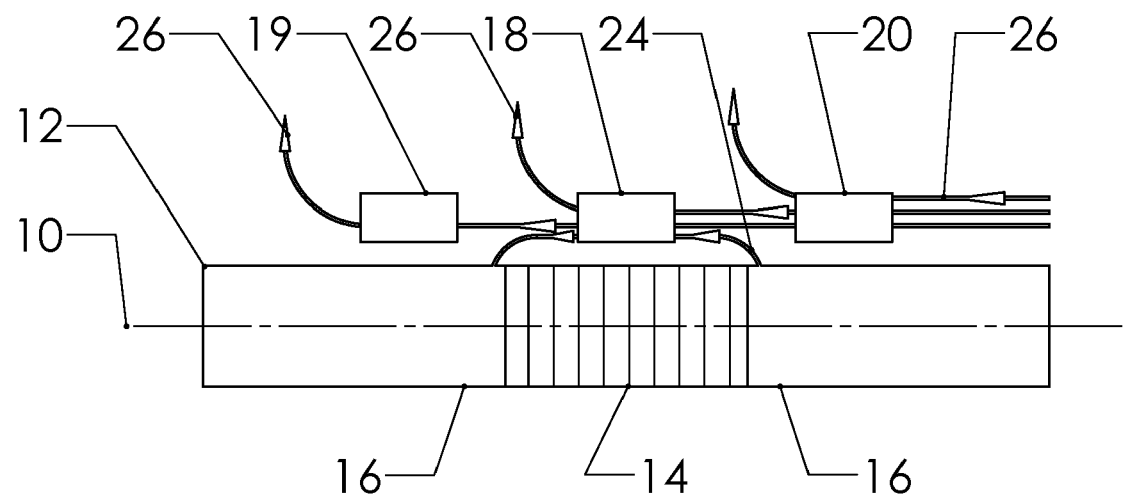
FIG. 2 shows a second schematic view of the present invention.

FIGS. 1 and 2 illustrate a preferred embodiment of a polarized band based torque sensing apparatus in accordance with the present invention. In this exemplary embodiment, the torque carrying shaft 12, having a torque T applied about a central longitudinal axis 10, has an magnetoelastically active portion 14 and at least one magnetic passive area 16 (e.g., a non-magnetized section). At least one active field sensor 18 is placed proximate to the magnetoelastically active portion 14 to detect the magnetic flux 24 arising from the applied torque, and at least one passive field sensor, 19 or 20, is placed on either side of the active field sensor 18, wherein the passive field sensors 19 and 20 are disposed in such a way that they are far away enough from the magnetoelastically active portion 14 to avoid the magnetic flux 24 dependent on the applied torque T.

Figure 3:
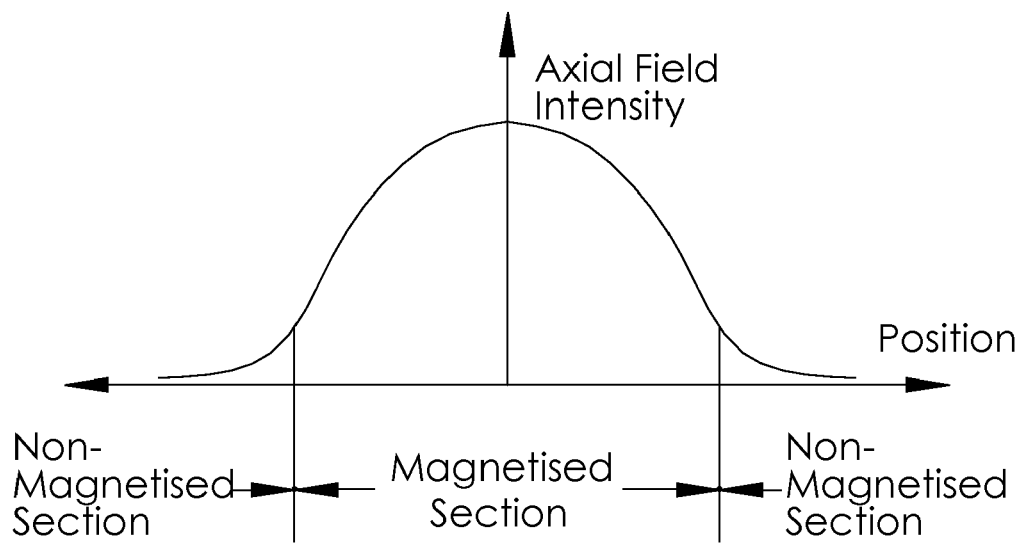
FIG. 3 shows axial magnetic field strength across the active magnetoelastic zone of the present invention.

FIG. 3 shows axial magnetic field strength arises from the applied torque T across the magnetoelastic active zone 14, the zone having a peak field strength in the center of the zone 14, and its strength gradually reduces toward the edges of the zone 14. The longer the zone 14, the flatter the peak. So, a longer magnetoelastic active zone can be utilized to minimize the effect of axial movement of the shaft 12.

The outputs of the active field sensor 18 and passive field sensors 19 and 20 are brought out by wire 22. One way to filter out unwanted magnetic flux is to use the following formula to process the output signals of these field sensors:

$$\text{Output} = S_a - \frac{S_{p19} + S_{p20}}{2}$$

where
Output=Transducer's output;
$S_a$=Output of active field sensor 18;
$S_{19}$=Output of passive field sensor 19; and
$S_{20}$=Output of passive field sensor 20.

If there is no torque applied, and there is no external magnetic flux source present, $S_a$ equals to $S_{p19}$ and $S_{p20}$ respectively, thus the output of the transducer is 0.

If a torque T is applied to the shaft 12, only active field sensor 18 is reacted to the magnetic flux 24 generated by the applied torque T, $S_a$ will increase or decrease depending on the direction of torque T, so the output of the active field sensor 18 is $S_a+S_t$, where $S_t$ is signal change dependent on applied torque, and when there is no change in external magnetic flux, $S_{p1}$ and $S_{p2}$ will remain the same as that before the torque T is applied, all the quantity sensed by active field sensor 18 arises from the applied torque T and the output formula is as follows:

$$\text{Output} = (S_a + S_t) - \frac{S_{p1} + S_{p2}}{2} = S_t$$

Magnetic flux variations 26 detected by passive sensors 19 or 20 indicate magnetic flux sources other than that caused by applied torque. There are several types of interfering magnetic flux sources. The strength of a magnetic field drops off roughly exponentially over distance, depending on the distance from interfering magnetic sources to the transducer. They can be classified into far fields and near fields. When an interfering magnetic source is far away enough, e.g., earth magnetic fields, the distance between the external magnetic source and the active and passive field sensors 18, 19 and 20, respectively, can be considered the same, hence, the outputs of all the field sensors caused by far fields is equal to each other. The formula become is:

$$\text{Output} = (S_t + S_{ea}) - \frac{S_{ep19} + S_{ep20}}{2}$$

where
$S_{ea}$=Output of active field sensor 18 caused by external magnetic flux 26;
$S_{ep19}$=Output of passive field sensor 19 caused by external magnetic flux 26; and
$S_{ep20}$=Output of passive field sensor 20 caused by external magnetic flux 26.

Because $S_{ea}=S_{ep19}$ and $S_{ea}=S_{ep20}$ when the external magnetic flux is uniform over the length of the transducer, the output signals of the active field sensor 18 and passive field sensors 19 and 20 caused by the far field cancels each other out.

When an interfering magnetic source is closer to the transducer, the signal output of the passive field sensor closer to the external source will be the largest, and the smallest in the passive field sensor farther away to the external source. Output of the active field sensor 18 will be between that of the two passive field sensors because its distance to the external source is between that of passive field sensors 19 and 20. For a given primary near field source, there is a setup that can place passive sensors 19 and 20 in relative to the active field sensor 18 so that the active field sensor's output is the average of the passive field sensors, thus the effect of this particular near field can be canceled out completely. This setup, of course, can not be adapted to completely cancel out the effects of different near fields at the same time; however, a certain variation caused by near fields is permitted in most cases.

For applications with very high demands for accuracy, another algorithm can be utilized to minimize the effect of near fields. If the output signal varies in a small time interval of passive field sensors $S_{p19}$ and $S_{p20}$ are equal, it indicates that active field sensor 18 also experiences the same non-torque output signal variation. If the changes of one passive field sensor's output is bigger than that of the other, it indicates that there is near field source or sources coming in, according to the relative location of passive field sensor 19 and 20 to each other and to the active field sensor 18, the output signal variation arising from a near field effect on the active field sensor 18 can be determined from known output changes of both passive field sensors and then filtered out, thus only a torque signal will be converted to a final transducer output.

Figure 4:
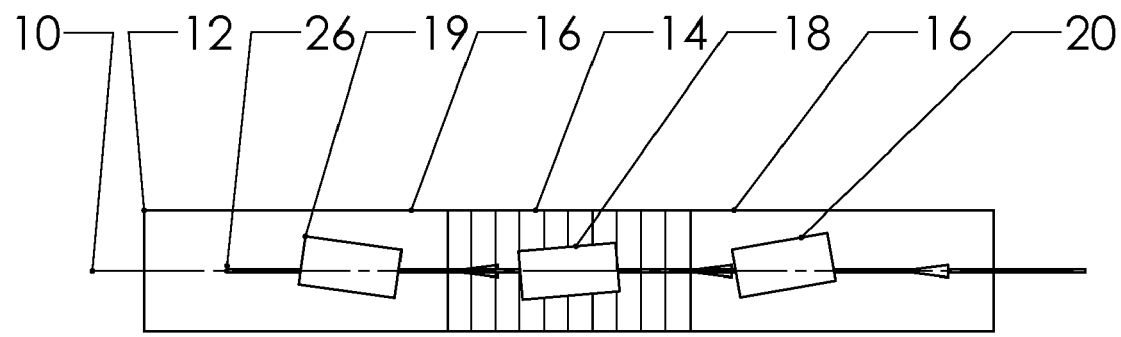
FIG. 4 shows a schematic view of the field sensors placement in a torque transducer of the present invention that may not perfectly line up in the real world due to manufacturing tolerances.

There are slight sensitivity differences between magnetic field sensors due to manufacturing tolerances, moreover, when assembling and soldering field sensors into a complete transducer, the field sensor's position will not be perfectly in line with each other, again due to manufacturing tolerances, as shown in FIG. 4. This results in output variation when they subjected to the same magnetic flux. This shortcoming can be overcome by calibrating the sensitivity of each group of field sensors after assembly, by putting the completed transducer in a uniform magnetic field, such as inside a Helmholtz coil, and comparing the output of the field sensors in each group, and electrically matching them if they are not identical. After doing so, each group of field sensors will have the same signal output when subjected to the same magnetic field flux. This sensitivity matching can be done in the x, y, and z directions. Common mode rejection is then completely achieved.

If there is uniform temperature variation across the length of the transducer, then all passive and active field sensors will experience the same output offset. If there is gradient variation of temperature along the length of the transducer, then the temperature offset of the active field sensor 18 is close to the average temperature offset of passive field sensors 19 and 20. In both cases, the temperature offset of the transducer will be automatically eliminated using the above signal process algorithms.

Figure 5A:
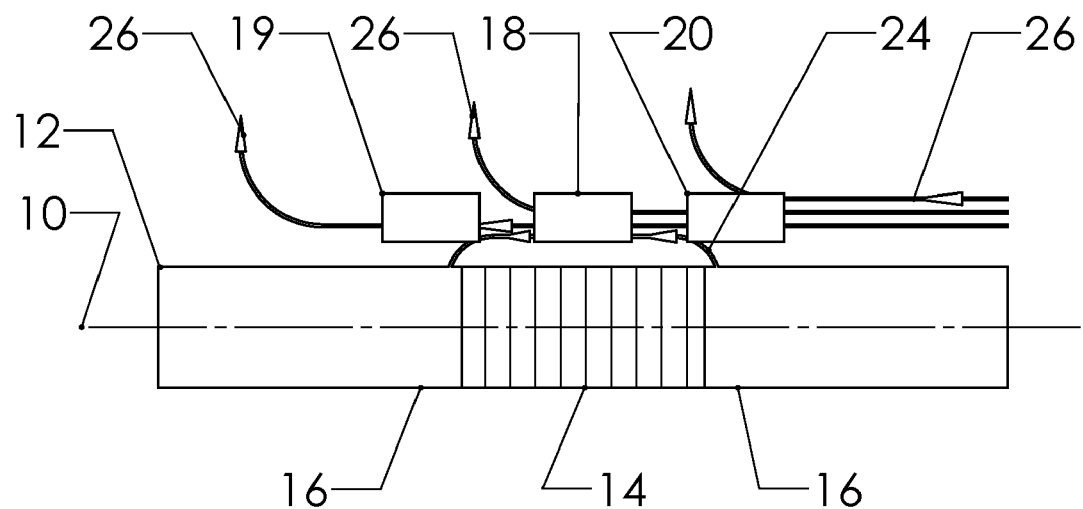
FIG. 5a through 5c show schematic views of alternative embodiments of the torque transducer of the present invention.

Alternatively, passive field sensors 19 and 20 can also be placed close to the magnetoelastic active zone 14, where their location has a lower field strength than that of active field sensor 18, as shown in FIG. 5a. There are several advantages of this arrangement. It require less axial space, it also partially compensates for temperature sensitivity drift, and partially compensates for rotational dependent output, because any temperature sensitivity drift and rotational dependent signals detected by active field sensor 18 will also be experienced by passive field sensors 19 and 20. Although this arrangement will lower the transducer's sensitivity, with the above self-compensating feature, the transducer is still capable of providing highly accurate measurements, immune from interfering external magnetic sources.

Figure 5B:
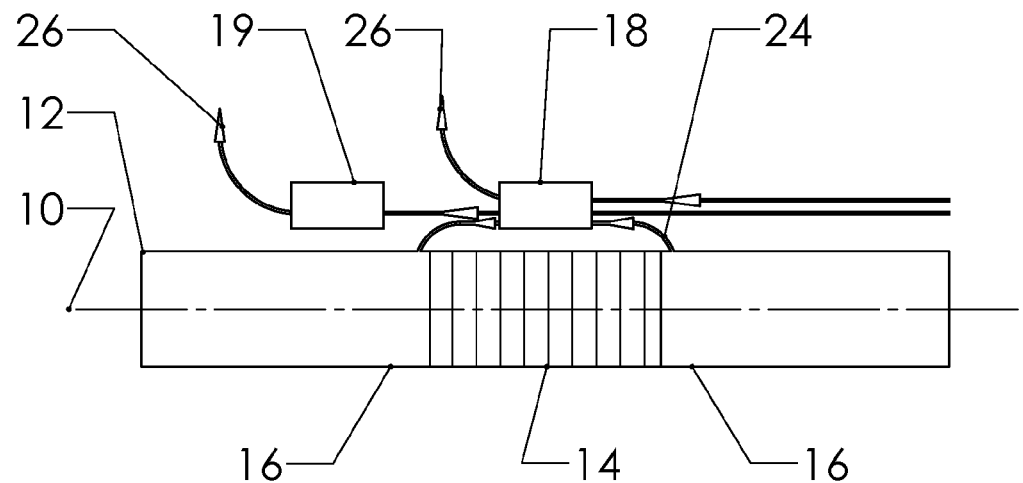
Figure 5C:
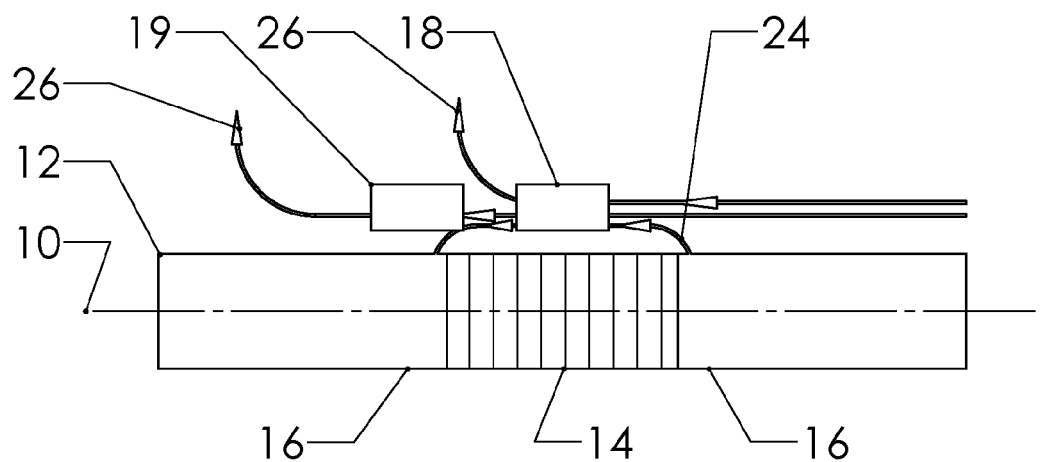

FIG. 5b and FIG. 5c show another kind of field sensor arrangement with the passive field sensor 19 placed on only one side of the active field sensor 18. This kind of arrangement can be use in applications where the transducer is protected from near fields.

Although these field sensor arrangements are shown and explained in polarized band based magnetoelastic torque transducers, they may also be utilized in permeability based types of magnetoelastic torque transducer, by placing pickup coils without excite coils (passive field sensor) on either side of the excite/pickup coils (active field sensor). Furthermore, other magnetic field sensing devices, such as magnetic speed sensors, magnetic linear position sensors, magnetic angle sensors, and magnetic force sensors can also utilize the present invention.

In summary, the embodiments of the present invention have been described above in which following points are particularly noted:

a) A torque carrying shaft with at least one magnetoelastic transducer element zone can be used in a torque sensor by sensing the change in the emanation of the magnetic flux from the zone, because the amount of flux emanating from the shaft varies with the torque applied;

b) At least one active magnetic field sensor and at least one passive magnetic field sensor disposed in such a way that the active field sensor is always in a position with a higher magnetic field strength caused by interested objects, such as torque, than that of the passive sensor. Passive A passive field sensor can be placed on both sides of the active field sensor, or on only one side of active field sensor. The transducer output is obtained by subtracting the processed signal output of the passive field sensor from that of the active field sensor, thus canceling out the interfering magnetic field flux and temperature offset on the transducer, and partially filters out the transducer's temperature sensitivity drift and rotational dependant signal;

c) The sensitivity of the field sensors do not match each other perfectly in most cases due to manufacturing tolerances. They can be electrically matched by calibrating the field sensor's sensitivity by putting the transducer inside a uniform magnetic field. In doing so, common mode rejection will be completely achieved;

d) There are several different kinds of magnetic flux field sensors, such as Flux gate; solid state sensors; Hall effect sensors, magnetoresistance devices; magnetometer; compasses; inductive coils; magnetodiodes; and magneto-optical sensors. One or more of these sensing elements may be used in conjunction with the others;

e) The above torque sensor arrangements can be utilized in polarized band based magnetoelastic torque sensors, as described above. They can also be utilized in permeability based magnetoelastic torque sensors by placing only passive pickup coils next to the excite and active pickup coils so that the influence of interfering magnetic fields can be filtered out and f) Further more Furthermore, other types of sensors that extract changes in magnetic fields to indirectly detect direction, speed, presence, force, linear position, or angle can also utilize the above arrangements to cancel out interfering magnetic fields.

I claimed:

1. A magnetic torque sensing system, comprising:
a shaft member having a longitudinal axis and operably mounted to have a torque applied to said member;
said shaft member having a transducer element with at least one magnetoelastic zone, wherein said magnetoelastic zone is either an integrally formed portion of said shaft member or attached to or forming a part of a surface of said shaft member;
said magnetoelastic zone being disposed along said longitudinal axis, its magnetic properties operable to vary under applied torque and as a function of a torque applied about said longitudinal axis;
a magnetic torque sensor system comprising a first sensor proximate to a peak field strength of said magnetoelastic zone arising from applied torque, and a second sensor placed farther away from said peak field strength than that of said first sensor, thereby said first sensor sensing more magnetic flux than said second sensor; and
a signal processing system to which said first sensor and said second sensor are operably associated therewith to either cancel out the effects of any external interfering magnetic flux or the effects of any temperature offset, reduce the effects of any rotational signal output and temperature sensitivity drift, or develop an output signal representing the torque about said longitudinal axis;
wherein said first sensor is an active field sensor and said second sensor is a passive field sensor, wherein there is at least one passive field sensor on one side of said active field sensor.

2. The system of claim 1, wherein said first sensor is a polarized band based magnetoelastic torque sensor.

3. The system of claim 1, wherein said first sensor is disposed proximate to said magnetoelastic zone.

4. The system of claim 1, wherein said first sensor is an active field sensor and said second sensor is a passive field sensor, wherein there is at least one passive field sensor on both sides of said active field sensor.

5. The system of claim 1, wherein said first sensor is a permeability based magnetoelastic torque sensor.

6. The system of claim 1, wherein at least one excite/active pickup coil is disposed proximate to said magnetoelastic zone.

7. The system of claim 1, wherein there is at least one passive pickup coil on both sides of an excite/active pickup coil disposed proximate said magnetoelastic zone.

8. The system of claim 1, wherein there is at least one passive pickup coil on either side of an excite/active pickup coil disposed proximate said magnetoelastic zone.

9. A system for canceling any external interfering magnetic fields and temperature offset effects for a magnetic field sensing arrangement, comprising:
a first sensor proximate to a magnetoelastic transducer zone;
a second sensor outside of said magnetoelastic transducer zone or a portion of said zone with a lower field strength than that of said first sensor; and
a signal processing system, wherein said system is operable to measure the magnetic field with said first and second sensors, operable to determine the magnetic field from said first and second sensors, operable to determine any external interfering magnetic field or temperature offset by processing the magnetic field detected from said second sensor, operable to subtract the processed magnetic field of said second sensor from that of said first sensor, and operable to convert the final magnetic field into an output signal representing the torque about a longitudinal axis of a rotatable shaft member;
wherein said first sensor is an active field sensor and said second sensor is a passive field sensor, wherein there is at least one passive field sensor on one side of said active field sensor.

10. The system of claim 9, wherein said first sensor is spaced from and does not contact said magnetoelastic transducer zone.

11. The system of claim 9, wherein said second sensor is positioned on both sides of said first sensor.

12. A method for matching the sensitivity of multiple magnetic field sensors operably associated with a magnetoelastic transducer, comprising:
positioning two or more magnetic field sensors in line with each other proximate to said magnetoelastic transducer, wherein said magnetic field sensors are operably associated with a signal processing system operable to generate an output signal representing the torque about a longitudinal axis of a rotatable shaft member;
placing said magnetic field sensors inside a uniform magnetic field;
determining a magnetic field from each of said magnetic field sensors; and
matching an output from each of said magnetic field sensors to make their outputs identical:

wherein said magnetic field sensors include a first sensor that is an active field sensor and a second sensor that is a passive field sensor, wherein there is at least one passive field sensor on one side of said active field sensor.

13. The method of claim 12, wherein the sensitivity of said magnetic field sensors may be matched in an x direction.

14. The method of claim 12, wherein the sensitivity of said magnetic field sensors may be matched in a y direction.

15. The method of claim 12, wherein the sensitivity of said magnetic field sensors may be matched in a z direction.

16. The system of claim 1, wherein said first sensor is spaced from and does not contact said magnetoelastic zone.

17. The method of claim 12, wherein said magnetic field sensors are spaced from and do not contact said magnetoelastic transducer.

* * * * *